(12) United States Patent
Han et al.

(10) Patent No.: US 7,629,739 B2
(45) Date of Patent: Dec. 8, 2009

(54) ORGANIC ELECTROLUMINESCENT DISPLAY DEVICE AND METHOD OF PREPARING THE SAME

(75) Inventors: Dong-Won Han, Suwon-si (KR); Kwan-Hee Lee, Suwon-si (KR); Jang-Hyuk Kwon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 539 days.

(21) Appl. No.: 11/146,142

(22) Filed: Jun. 7, 2005

(65) Prior Publication Data

US 2005/0285510 A1  Dec. 29, 2005

(30) Foreign Application Priority Data

Jun. 9, 2004  (KR) ........................ 10-2004-0042211
Jun. 17, 2004 (KR) ........................ 10-2004-0045031

(51) Int. Cl.
    *H01J 1/62* (2006.01)
(52) U.S. Cl. ........................... 313/504; 313/506; 445/24
(58) Field of Classification Search ................. 313/504, 313/498–512; 315/169.1, 169.3; 438/26–29, 438/34, 82; 445/24–25; 428/690–691, 917; 257/40, 72, 98–100, 642–643, 759; 427/66, 427/532–535, 539, 58, 64
See application file for complete search history.

(56) References Cited

U.S. PATENT DOCUMENTS

| 4,042,758 | A | * | 8/1977 | Weinstein et al. | 429/111 |
| 5,633,194 | A | * | 5/1997 | Selvakumar et al. | 117/103 |
| 5,874,803 | A | * | 2/1999 | Garbuzov et al. | 313/506 |
| 6,406,802 | B1 | * | 6/2002 | Arai et al. | 428/690 |
| 6,602,588 | B1 | | 8/2003 | Kwon et al. | |
| 6,660,340 | B1 | | 12/2003 | Kirkpatrick | |
| 2003/0071567 | A1 | * | 4/2003 | Eida et al. | 313/504 |
| 2004/0051447 | A1 | * | 3/2004 | Okinaka et al. | 313/504 |
| 2004/0160171 | A1 | * | 8/2004 | Takahashi | 313/504 |

FOREIGN PATENT DOCUMENTS

| JP | 2000-223264 | 8/2000 |
| JP | 2001-043980 | 2/2001 |

(Continued)

*Primary Examiner*—Peter J Macchiarolo
*Assistant Examiner*—Donald L Raleigh
(74) *Attorney, Agent, or Firm*—H.C. Park & Associates, PLC (57) ABSTRACT

The present invention provides an organic electroluminescent display device and a method of preparing the same. The organic electroluminescent display device may include a first electrode formed on a substrate. A second electrode may be formed so as to be insulated from the first electrode. One or more organic layers may be interposed between the first electrode and the second electrode and include at least an emission layer. One layer or a plurality of layers may be formed on the second electrode and comprise a material or materials having a refractive index higher than a refractive index used to form a material that comprise the second electrode. An organic electroluminescent display device fabricated in this matter has improved efficiency of light extraction. Such a device also resists infiltration of moisture and oxygen to a luminous part of the device that includes the first electrode, the second electrode, and the organic layer.

16 Claims, 4 Drawing Sheets

FOREIGN PATENT DOCUMENTS

| | | |
|---|---|---|
| JP | 2002-334792 | 11/2002 |
| JP | 2002-367770 | 12/2002 |
| JP | 2004-079291 | 3/2004 |
| JP | 2004-127608 | 4/2004 |
| KR | 10-2001-0067868 | 7/2001 |
| KR | 1020030037451 A1 | 5/2003 |
| WO | 03/050894 | 6/2003 |
| WO | 2004/028340 | 4/2004 |

* cited by examiner

ORGANIC ELECTROLUMINESCENT DISPLAY DEVICE AND METHOD OF PREPARING THE SAME

CROSS-REFERENCE TO RELATED APPLICATIONS

This application claims priority to Korean Patent Application No. 10-2004-0042211, filed on Jun. 9, 2004 and to Korean Patent Application No. 10-2004-0045031, filed on Jun. 17, 2004, in the Korean Intellectual Property Office, the disclosures of which are herein incorporated by reference in their entireties.

BACKGROUND OF THE INVENTION

1. Field of the Invention

The present invention generally relates to flat panel display devices and methods for fabricating the same and, more particularly, to an organic electroluminescent display (OLED) device that may have superior efficiency of light extraction and superior resistance to moisture and oxygen infiltration, and to a method of manufacturing the same.

2. Description of Related Art

Flat panel displays may be categorized as emissive devices or as non-emissive devices. Examples of emissive devices are a flat cathode ray tube (CRT), a plasma display panel, an electroluminescent device, and a light emitting diode. An example of a non-emissive device is a liquid crystal display (LCD). Of these display devices, electroluminescent devices have wider viewing angles, faster video response speeds, and lower power consumption than conventional CRT displays. Other advantages over CRTs include increased brightness, lighter weight, improved durability, and expanded ranges of operating temperatures. Electroluminescent devices may be classified as organic or inorganic depending on a type of material that forms the electroluminescent device's emission layer. For these and other reasons, electroluminescent devices including OLEDs are considered to be next-generation replacements of CRT displays.

An OLED device includes an emission layer composed of an organic compound sandwiched between an anode and a cathode. When a voltage is applied to each of the anode and cathode, holes from the anode migrate, via a hole transport layer, to an emission layer. Electrons from the cathode migrate, via an electron transport layer (ETL), to the emission layer, in which the electrons and holes recombine to generate exitons. As the exitons fall from their excited state to a ground state, they cause fluorescent molecules of the emission layer to emit light. Images are formed by selectively switching patterns of unit pixels on and off. Full color OLED devices have pixels that may emit red (R), green (G), or blue (B) light.

To ensure a long operating life, the emission layer and the cathode on the emission layer should be shielded from moisture to be protected from exfoliation and shielded from oxygen infiltration to be protected from oxidation. An example of shielding is set forth in Korean Patent Publication No. 2001-0067868, which discloses forming a layer of an insulating polymer compound, such as high density polyethylene, on an emission layer and a metal electrode using a vacuum system; forming a layer of an inorganic metal on the polymer compound layer; forming a layer of an insulating inorganic metal on the inorganic metal layer; and forming a layer of an insulating polymer compound on the insulating inorganic metal layer. Nevertheless, the lifespan of the OLED taught by Korean Patent Publication No. 2001-0067868 may not reach satisfactory levels and may have poor light extraction efficiency, and thus improvement is needed.

SUMMARY OF THE INVENTION

The present invention provides an organic electroluminescent display (OLED) device that may have superior light extraction efficiency and resistance to moisture and oxygen infiltration, and a method of fabricating the same. The OLED device may include a substrate on which a first electrode is provided. A second electrode is formed so as to be insulated from the first electrode. One or more organic layers may be interposed between the first electrode and the second electrode and may include at least an emission layer. One layer or a plurality of layers may be formed on the second electrode and may comprise a material or materials having a refractive index that is higher than a refractive index of a material forming the second electrode.

The organic electroluminescent display device of the present invention as described above may exhibit superior image quality due to both improved efficiency of light extraction and color purity. Also, the organic electroluminescent display device of the present invention has an improved lifespan due to its protection from moisture and oxygen infiltration of an emission part comprising a first electrode, a second electrode, and an organic layer.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

The present invention will be described in more detail with reference to the attached drawings. One embodiment of the organic electroluminescent display (OLED) device of the present invention is illustrated in FIG. 1, which is a cross-sectional view of an active matrix type OLED device 10.

Figure 1:
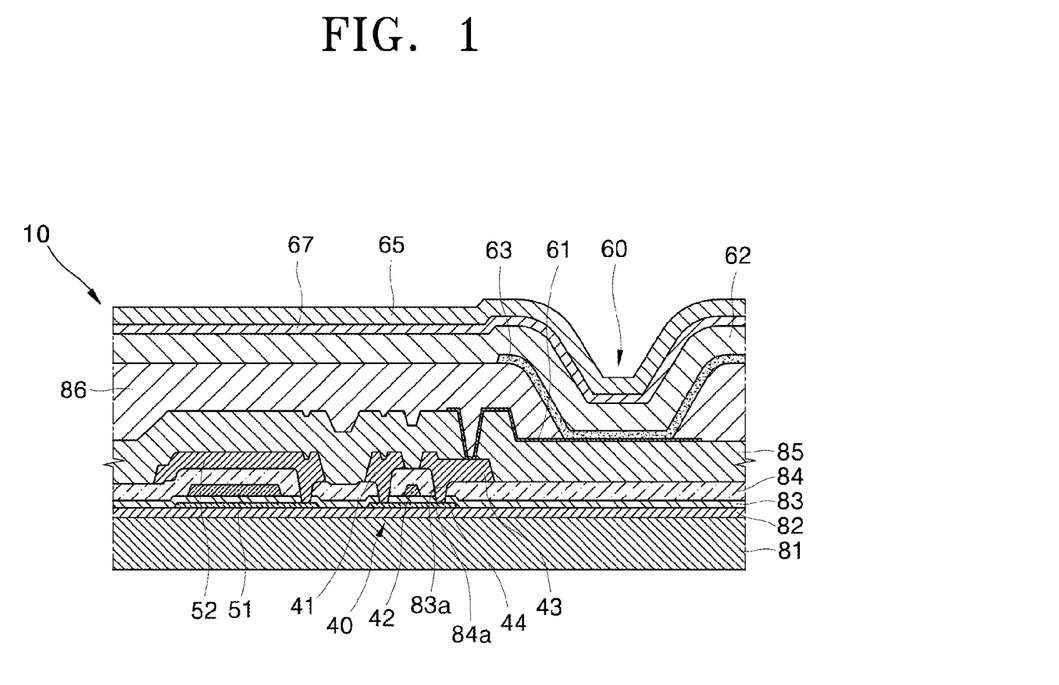
FIG. 1 is a cross-sectional view of an organic electroluminescent display device manufactured in accordance with the principles of the present invention.

Referring to FIG. 1, the OLED device 10 includes a substrate 81 that may be composed of a transparent material, such as but not limited to, glass or plastic. A buffering layer 82 may be optionally formed to uniformly cover an upper surface of the substrate 81.

An active layer 44 arranged in a predetermined pattern may be formed on the buffering layer 82. The active layer 44 may be embedded under a gate insulating layer 83. A gate electrode 42 may be formed on the gate insulating layer 83 in a region that corresponds to the active layer 44. The gate electrode 42 may be embedded by an intermediate insulating layer 84. After the intermediate insulating layer 84 is formed, the gate insulating layer 83 and the intermediate insulating layer 84 may be etched by an etching process such as dry etching to form contact holes 83a, 84a, thereby allowing a part of the active layer 44 to be exposed.

To form a thin film transistor (TFT) 40, a source electrode 41 is coupled to the source region of the active layer 44 through contact holes 83a, 84a, and a drain electrode 43 is coupled to the drain region of the active layer 44 through contact holes 83a and 84a. The source electrode 41 and the drain electrode 43 may be embedded in a protective layer 85. After forming the protective layer 85, a portion of the drain electrode 43 is exposed through an etching process. Additionally, the OLED may include an upper plate 52 of a capacitor and a lower plate 51 of a capacitor.

The protective layer 85 may comprise an insulator. The protective layer 85 may also be an inorganic layer, such as silicon oxide or silicon nitride. Alternatively, the protective layer 85 may be an organic layer, such as acryl or Benzocyclobutene (BCB). In one embodiment, a separate insulating layer for planarization may be further formed on the protective layer 85. A pixel defining layer (PDL) 86 may be arranged on the protective layer 85.

The organic light emitting diode 60, which is arranged in an opening in the PDL 86, displays a predetermined image by emitting red (R), green (G) or blue (B) light in proportion to the application of an electric current. The first electrode 61 (pixel electrode) may connect to the drain electrode 43 of TFT 40. A second electrode 62 (counter electrode) may be deposited to completely cover the entire pixel. An emission layer 63 may be interposed between the first electrode 61 and the second electrode 62.

The first electrode 61 and the second electrode 62 may be insulated from each other. Each electrode may apply voltages of polarities different from each other to the emission layer 63 in order to emit light.

The emission layer 63 may comprise a low molecular weight or high molecular weight organic material. When using a low molecular weight organic material, a hole injection layer (HIL), a hole transport layer (HTL), an emission layer (EML), an electron transport layer (ETL), an electron injection layer (EIL), and the like may be laminated in a single or multi-layered structure. Examples of the available organic material include copper phthalocyanine (CuPc), N,N'-di(naphthalene-1-yl)-N,N'-diphenyl-benzidine (NPB), tris-8-hydroxyquinoline aluminum (Alq3), and the like. The layers of low molecular weight organic materials may be formed by vacuum evaporation.

When using a high molecular weight organic material, the emission layer 63 may include an HTL and an EML. Poly(3,4-ethylenedioxythiophene)(PEDOT) may be used for the HTL and a high molecular weight organic material, such as poly-phenylenevinylene (PPV) based compounds, and polyfluorene based compounds is used for the EML. The layers of high molecular weight materials may be formed by screen printing or inkjet printing.

The organic emission layer is not limited to the embodiments as described above and various embodiments can be applied. For example, first electrode 61 may act as an anode, and the second electrode 62 may act as a cathode or their functions may be reversed. The first electrode 61 may be patterned so as to correspond to a region of each pixel, and the second electrode 62 may be formed so as to completely cover the entire pixel.

The first electrode 61 may be fabricated as a transparent electrode or as a reflective electrode. When the first electrode 61 is a transparent electrode, it may comprise ITO, IZO, ZnO, or $In_2O_3$. When the first electrode 61 is a reflective electrode, it may be fabricated by first forming a reflective layer comprising Ag, Mg, Al, Pt, Pd, Au, Ni, Nd, Ir, Cr, or a combination thereof, and then forming a transparent electrode layer comprising ITO, IZO, ZnO, or $In_2O_3$ thereon. Meanwhile, the second electrode 62 may also be fabricated as either a transparent electrode or as a reflective electrode. When the second electrode 62 is a transparent cathode, it may comprise ITO, IZO, ZnO, or $In_2O_3$. An assisting electrode layer or bus electrode line may be formed of a metal with a low work function, i.e., Li, Ca, LiF/Ca, LiF/Al, Al, Ag, Mg, or a combination thereof, and coupled to the transparent second electrode 62. When the second electrode 62 is a reflective electrode, a reflective layer comprising a metal with low work function, i.e., Li, Ca, LiF/Ca, LiF/Al, Al, Ag, Mg, or a combination thereof may be deposited so as to reflect light toward the organic emission layer 63.

The second electrode 62 may be formed so as to be insulated from the first electrode 61. One or more organic layers may be interposed between the first electrode 61 and the second electrode 62 and may include at least an emission layer. One layer or a plurality of layers formed on the second electrode 62 may comprise a material or materials having a refractive index higher than a refractive index of a material used to form the second electrode 62 in order to maximize the light extraction efficiency through the second electrode 62. Laminating one layer or a plurality of layers on the second electrode 62 may prevent moisture and oxygen from permeating into the first electrode 61, the second electrode 62, and the organic layer located below. When a plurality of layers are formed on the second electrode 62, the layers can be laminated such that the refractive indexes of the materials of each of the layers sequentially increase in a direction outward from the second electrode 62 in order to maximize the light extraction efficiency through the second electrode 62.

Examples of the material which may be laminated on the second electrode 62 include insulating organic or inorganic materials, such as metal oxide, metal nitride or metal fluoride. Examples of inorganic materials that may be laminated on the second electrode 62 are shown in Table 1 together with their respective refractive indexes.

TABLE 1

| Compound | Refractive index |
|---|---|
| MgO | 1.72 |
| $Al_2O_3$ | 1.63 ~ 1.64 |
| $Al_2O_3 + ZrO_2$ | 1.66 ~ 1.75 |
| SiO | 1.9 |
| $SiO_2$ | 1.46 |
| $Sc_2O_3$ | 1.9 |
| TiO | 2.35 |
| $TiO_2$ | 2.2 ~ 2.4 |
| $Ti_2O_3$ | 2.34 |
| $TiO_2 + ZrO_2$ | 2.13 |
| $Ti_3O_5$ | 2.31 |
| $Ti_4O_7$ | 2.34 |
| ZnO | 2.1 |
| $Y_2O_3$ | 1.87 |
| $ZrO_2$ | 2.05 |
| $Nb_2O_5$ | 2.3 |
| $MoO_3$ | 1.9 |
| $Sb_2O_3$ | 2.1 |

TABLE 1-continued

| Compound | Refractive index |
|---|---|
| $La_2O_3$ | 1.9 |
| $HfO_2$ | 1.9 ~ 2 |
| $Ta_2O_5$ | 2.1 |
| $In_2O_3$ | 2 |
| $In_2O_3 + SnO_2$ | 2 |
| $SnO_2$ | 2 |
| $Ta_2O_5$ | 2.1 |
| $WO_3$ | 1.68 |
| $Bi_2O_3$ | 1.9 |
| $CeO_2$ | 2.13 |
| $Eu_2O_3$ | 1.9 |
| $Pr_6O_{11}$ | 1.93 |
| $Nb_2O_3$ | 2.15 |
| $Nb_2O_5$ | 2.2 |
| $Sm_2O_3$ | 1.9 |
| $Yb_2O_3$ | 1.93 |
| LiF | 1.36 |
| NaF | 1.3 |
| $Na_5Al_3F_{14}$ | 1.33 |
| $Na_3AlF_6$ | 1.35 |
| $MgF_2$ | 1.38 |
| $AlF_3$ | 1.4 |
| $CaF_2$ | 1.4 |
| $SrF_2$ | 1.4 |
| $YF_3$ | 1.52 |
| $BaF_2$ | 1.3 |
| $LaF_3$ | 1.59 |
| $CeF_3$ | 1.63 |
| $PbF_2$ | 1.75 |
| $NbF_3$ | 1.55 |
| $SmF_3$ | 1.6 |
| ZnS | 2.3 |
| Ge | 4.0 |
| Si | 3.3 |

The refractive index of a material laminated on the second electrode 62 may be 0.01 to 3.0, and preferably 0.3 to 1.5 higher than a refractive index of a material that forms the second electrode 62.

The differences in the refractive indexes as described above may be obtained from the refractive indexes of the materials listed in Table 1.

In another embodiment, the present invention may provide a method of fabricating an OLED device. Steps of the method may be performed in any suitable order and may include: forming a first electrode on a substrate; forming one or more organic layers including at least an emission layer on the first electrode; forming a second electrode on the organic layer; and forming on the second electrode a layer or a plurality of layers comprising a material or materials having a refractive index higher than a refractive index of a material that forms the second electrode. That is, the values of each refractive index may increase in a direction extending away from the second electrode.

In one embodiment, buffering layer 67 may be formed on the second electrode 62 and a protective layer 65 may be formed on the buffering layer 67. The buffering layer 67 and the protective layer 65 are further described with reference to FIG. 2A, below.

Figure 2A:
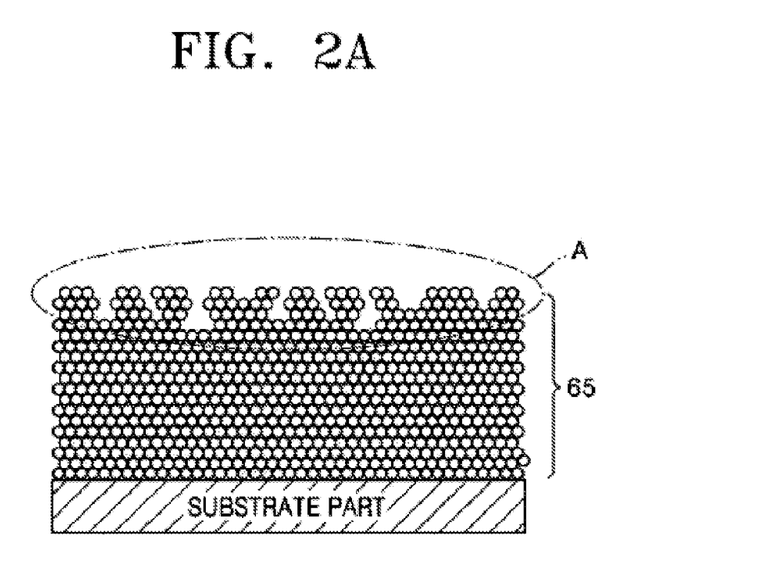
FIG. 2A schematically illustrates an arrangement of atoms constituting a protective layer that may be incorporated in the organic electroluminescent device of the present invention.
Figure 2B:
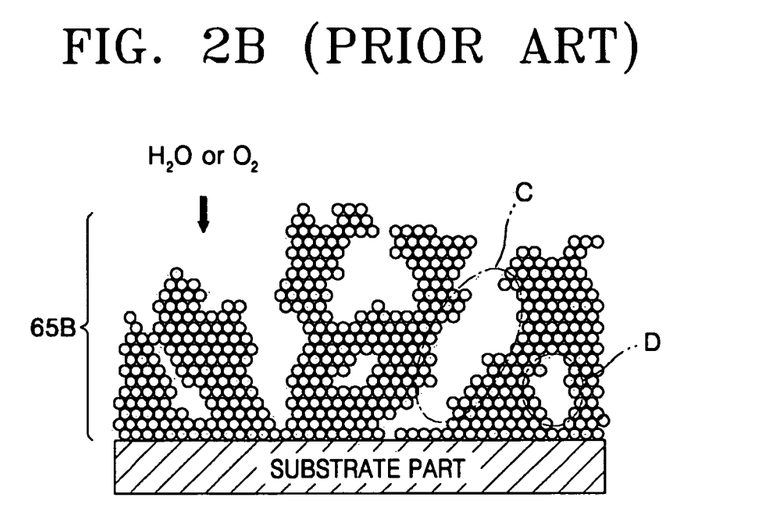
FIG. 2B schematically illustrates an arrangement of atoms constituting a conventional protective layer.

FIG. 2A illustrates an exemplary arrangement of atoms comprising the protective layer 65 in one embodiment of the present invention. FIG. 2B illustrates a typical arrangement of atoms in a conventional protective layer.

Referring to FIG. 1 and FIG. 2A, the protective layer 65 of the present invention may have a surface roughness of about 5 Å. Atoms constituting the protective layer 65 having the surface roughness in the above range tend to be compactly arranged. In contrast, the atoms constituting the conventional protective layer 65B of FIG. 2B tend to contain voids C and defects D, which are breakages of the atomic arrangement. As FIG. 2A illustrates, such voids and defects are not substantially present in the compactly arranged protective layer 65 of the present invention, which improves the lifespan of the OLED device 10 by preventing oxygen and/or moisture from permeating through the surface A of protective layer 65 and into contact with the second electrode 62. When the surface roughness of the protective layer 65 is greater than about 50 Å, the invention's compact atomic structure is not achieved, and thus permeation of oxygen and/or moisture cannot be prevented.

The protective layer 65 may comprise at least one compound of metal oxides and nitrides. Examples of the metal oxides and nitrides include $SiO_x$, $SiN_x$ ($x \geq 1$), TiO, TaO, and the like, but are not limited thereto. The protective layer 65 can further include a network former in addition to the metal oxide and nitride. Herein, the term "network former" means a material that improves an interatomic network by forming bonds of disconnected networks of atoms constituting a base material (which may be an insulating material formed of a metal oxide or metal nitride that contains a network former). Examples of a suitable network former include Li, Na, K, Ca, Sn, Rb, Cs, Ba, Pb, Be, Mg, Ce and Nb, but are not limited thereto. For example, the protective layer 65 may be $SiO_2$ or SiSnO where Sn acts as the network former, but the composition of the protective layer 65 is not limited thereto.

Figure 3:
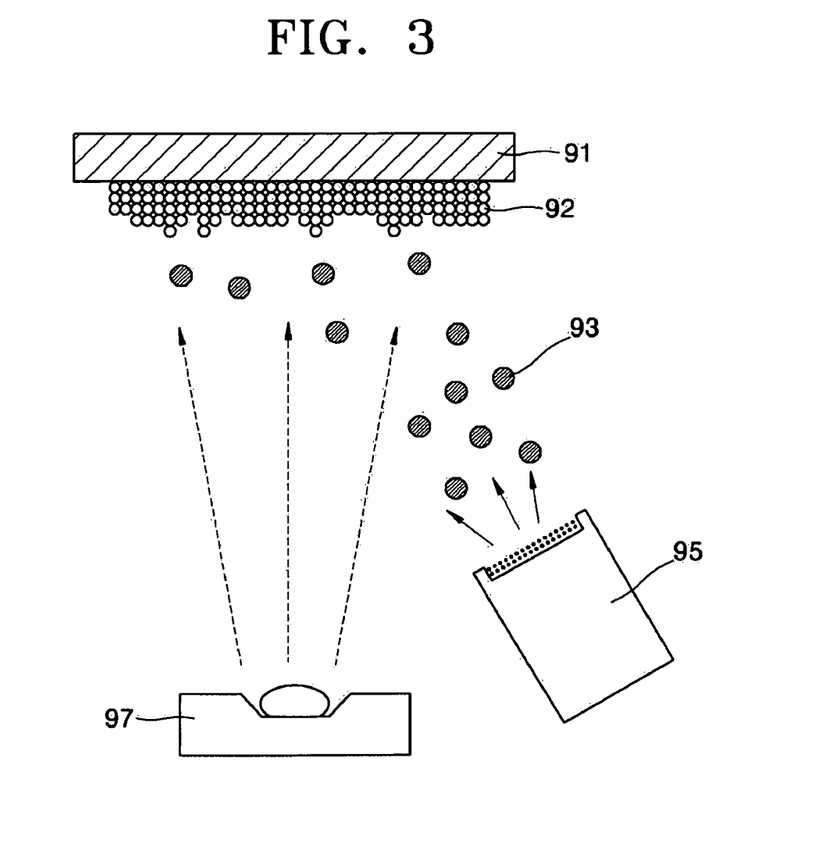
FIG. 3 schematically illustrates an ion beam assisted deposition (IBAD) technique that may be used to fabricate an OLED of the present invention.

The protective layer 65 may be formed using an ion beam assisted deposition (IBAD) method that includes an evaporation source and an ion beam source. FIG. 3 illustrates an exemplary operation of an IBAD technique. Referring to FIG. 3, when depositing particles 92 emitted from an evaporation source 97 adhere to a surface of a substrate 91, ions 93 emitted from an ion beam source 95 increase the surface mobility of the particles 92 and cause the particles 92 to be compactly deposited on the substrate 91.

The particles 92 emitted from the evaporation source 97 of the IBAD become/form the material constituting the protective layer 65. Examples of the particle 92 include metal oxides and nitrides, and more specifically, $SiO_x$, $SiN_x$ ($x \geq 1$), TiO, TaO, and the like, but are not limited thereto. The particles 92 emitted from the evaporation source 97 may further include the network former as described above in addition to the metal oxide and nitride.

The ions 93 emitted from the ion beam source 95 may be a material that constitutes a substrate on which a protective layer is formed, for example, materials that cannot react with the material constituting the second electrode 62 and any particle emitted from the evaporation source as described above. An example of a suitable ion includes ions of inert gas. More specifically, $Ar^+$, $Kr^+$ or $Xe^+$ ions may be used.

The energy of the ion beam source 95 of the IBAD may be about 50 eV to about 200 eV, and is preferably about 80 eV to about 150 eV. When the energy of the ion beam source 95 is less than about 50 eV, the energy of ions 93 emitted from the ion beam source 95 becomes too low to increase the surface mobility of the particles emitted from the evaporation source 97, and thus a compact protective layer having a high density and low surface roughness cannot be formed. When the energy of the ion beam source 95 is greater than 200 eV, the energy of the ions 93 emitted from the ion beam source 95 is so high that ions 93 emitted from the ion beam source 95 may etch the protective layer 65 formed. Thus, about 150 eV is preferred.

When forming the protective layer 65 using the IBAD, a ratio of the number of particles 92 emitted from the evaporation source 97 to the number of ions 93 emitted from the ion beam source 95 may be 1:1, and preferably 0.9:1. When the number of ions 93 emitted from the ion beam source 95 is above the range, the protective layer 65 may be etched by ions 93 emitted from the ion beam source 95 as the protective layer 65 is formed. When the number of ions 93 emitted from the ion beam source 95 is below the range, the number of the ions 93 is too low to form a compact protective layer 65 having a high density and low surface roughness.

The above ratio may be controlled by adjusting the ion flux of the ion beam source 95 and/or adjusting an inflow of gas for generating ions. For example, when forming a protective layer 65 composed of SiSnO by using an evaporation source 97 to emit both silicon oxide particles and Sn particles and an ion beam source 95 to emit argon ions, the ratio of the number of silicon oxide particles and Sn particles to the number of argon ions may be controlled to be 1:1 by adjusting an ion flux of the ion beam source 95 to about 50 mA and by adjusting an inflow of argon gas to about 5 sccm.

When forming the protective layer 65 using the IBAD, the evaporation source 97 may be either a thermal evaporation source or an electron beam evaporation source. Examples of an ion beam source 95 include a Kaufmann-type ion gun, an Endhall-type ion gun, an rf-type ion gun, and the like. These sources may be easily selected by those skilled in the art to implement the principles of the present invention.

The protective layer 65 may be formed by IBAD as described above. Since the evaporation source 97 and the ion beam source 95 are simultaneously used in the IBAD, a substrate part on which particles emitted from the evaporation source 97 will be deposited may be impaired by ions 93 emitted from the ion beam source 95. In particular, a front emission organic electroluminescent display device may include a second electrode 62 that is very thin, for example, about 200 Å or less. Such a thin second electrode 62 may be impaired by ions 93 emitted from the ion beam source 95 when the protective layer 65 is formed by IBAD. This impairment may damage the organic layer 63. If the organic material of the organic layer 63 is decomposed by ions 93 emitted from the ion beam source 95, a leakage current may occur when the organic electroluminescent device operates. The leakage current may result in poor pixel lamination and reduced operating lifespan. Either phenomenon reduces the reliability of the organic electroluminescent display device. To prevent the second electrode 62 and the organic layer 63 from being impaired when the protective layer 65 is formed, a buffering layer 67 may be included between the second electrode 62 and the protective layer 65.

The thickness of the buffering layer 67 may be about 300 Å to about 1000 Å, and preferably about 500 Å. When the buffering layer 67 is less than about 300 Å thick, the second electrode 62 and the organic layer 63 may be impaired when the protective layer 65 is formed. When the buffering layer 67 is about 1000 Å thick, the deposition time lengthens. In some cases, a thick buffering layer 67 may lower the efficiency of light extraction.

The buffering layer 67 may comprise a metal oxide or nitride, or an organic material. Examples of a metal oxide or nitride include silicon oxide, silicon nitride, tin oxide, and the like. An example of an organic material includes copper phthalocyanin, but is not limited thereto.

To maximize the efficiency of light extraction, the buffering layer 67 may comprise a material having a refractive index higher than a refractive index of a material that forms the second electrode 62 but less than a refractive index of a material that forms the protective layer 65. The refractive index of a material of the buffering layer 67 may be selected with reference to refractive indexes described in Table 1.

The buffering layer 67 may comprise a material having an optical band gap of about 3.0 eV to about 6.0 eV. The optical band gap should not be less than 3.0 eV. If the optical band gap drops below the 3.0 eV threshold, the buffering layer 67 may become opaque. An opaque buffering layer 67 may reduce the efficiency of the light extraction. Alternatively, an undesired leakage current caused by electroconductivity may occur.

Thus, the method of preparing the organic electroluminescent display device according to the present embodiment includes forming the buffering layer 67 on the second electrode 62 prior to forming the protective layer 65. The buffering layer 67 may be formed using a common deposition method, such as vacuum evaporation or a coating method, such as a spin coating method. The method of forming the buffering layer 67 may be easily selected by those skilled in the art according to the physical properties of a material used to form the buffering layer 67. After forming the buffering layer 67, the protective layer 65 may be formed as described above.

Although the organic electroluminescent display device and the method of preparing the same according to embodiments of the present invention have been described using the active matrix organic electroluminescent display device as an example, the present invention is not limited thereto.

The present invention will now be described in greater detail with reference to the following examples.

EXAMPLE 1

ITO, PEDOT with a thickness of 500 Å, PPV with a thickness of 800 Å, LiF with a thickness of 10 Å, and Mg:Ag with a thickness of 160 Å were sequentially laminated on a glass substrate and a SnOx layer with a thickness of 400 Å was formed on the Ag layer using a thermal deposition method. Thereafter, 1 g of silicon oxide powder was prepared as a silicon oxide deposition source and 1 g of Sn was prepared as a Sn deposition source. Then, a container including the silicon oxide deposition source, the Sn deposition source, an ion beam source, a thermal evaporation source, a substrate holder, and a rotation shaft for rotating the substrate holder was prepared. Those prepared as described above were used as the silicon oxide deposition source and the Sn deposition source, an EndHall-type ion gun (available from Infovion Co., Ltd.) was used as the ion beam source, and Helisys (available from ANS Co., Ltd.) was used as the thermal evaporation source. The prepared substrate was mounted in the substrate holder positioned so as to face the silicon oxide deposition source and the Sn deposition source. Then, the container was operated under the condition as illustrated in Table 2 to form a SiSnO layer with a thickness of 800 Å on the SnOx layer.

TABLE 2

| | |
|---|---|
| Basic pressure | $1.0 \times 10^{-7}$ Torr |
| Gas flux | Oxygen flux - 2 sccm |
| | Argon flux - 5 sccm |
| Thermal evaporation source | Tungsten boat, BN boat |
| Operation conditions of thermal evaporation source | 200 A |
| Ion beam source | EndHall-type ion gun |
| Operation conditions of ion beam source | Discharge current - 500 Ma |
| | Discharge voltage - 300 V |
| | Beam Voltage - 150 eV |
| | Beam Current - 50 mA |
| Deposition angle | 90° |
| Substrate RPM | 4.5 |
| Temperature of substrate | 80° C. |
| Deposition rate | 5 Å/sec |

The device thus-obtained having the SnOx layer and the SiSnO layer is called "Sample 1".

EXAMPLE 2

Sample 2 was prepared in the same manner as in Example 1, except that a SiSnO layer with a thickness of 300 Å rather than 800 Å was formed.

Comparative Example 1

A SiSnO layer was formed on the Mg:Ag layer in the same manner as in Example 1, except that the Mg:Ag layer was formed to a thickness of 100 Å instead of 160 Å and a SnO layer was not formed. This was called "Sample A".

Evaluation Example 1

Evaluation for Surface Morphology of the SiSnO Layer

The surface roughness of the SiSnO layer of Sample 1 was determined through a SEM photograph. As a result, the surface roughness (rms) of the SiSnO layer of Sample 1 was 30 Å.

Evaluation Example 2

Evaluation for Leakage Current

Figure 4A:
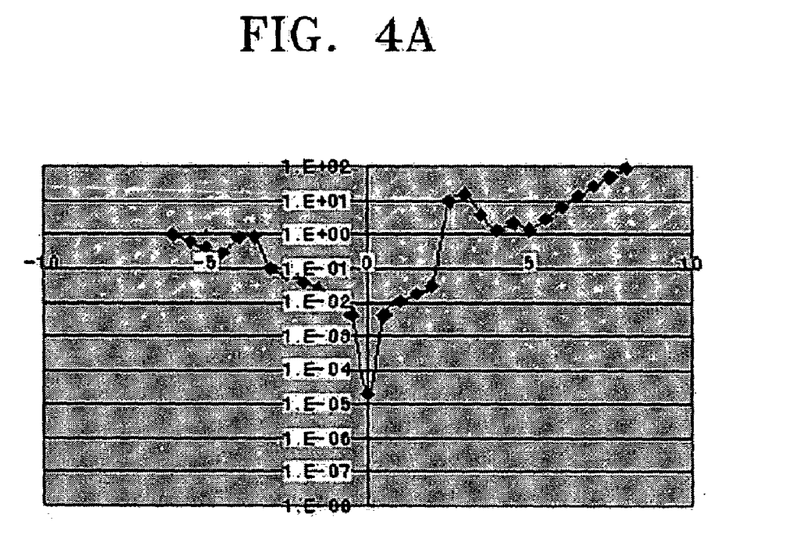
FIG. 4A is a graph illustrating the leakage current of a conventional OLED device that has no buffering layer.
Figure 4B:
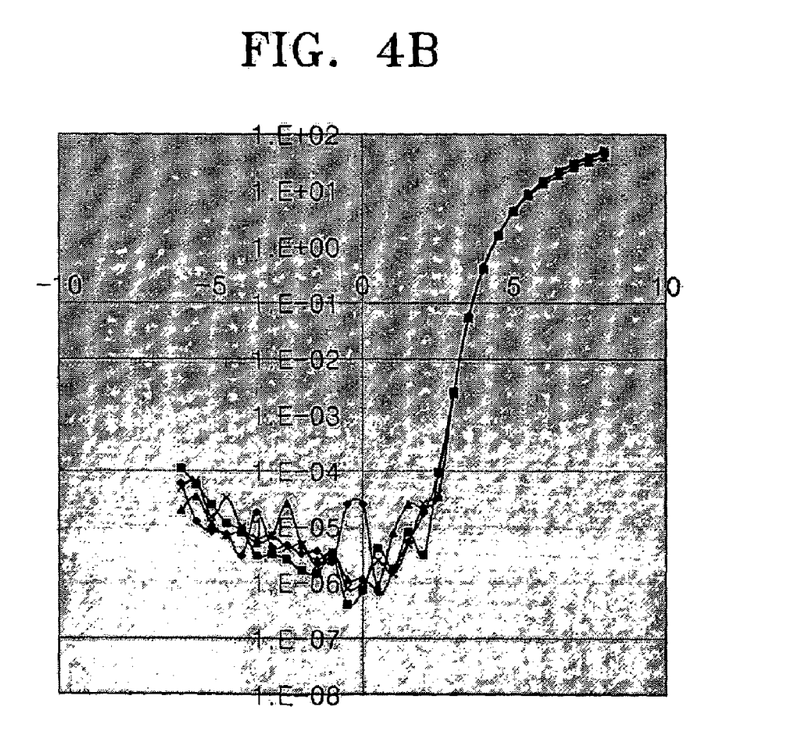
FIG. 4B is a graph illustrating the leakage current of an OLED device manufactured according to the principles of the present invention to have a buffering layer.

The leakage current occurring when Sample A and Sample 1 were operated and measured using an amperemeter. The results are illustrated in FIG. 4A and FIG. 4B. In FIG. 4A, the x axis represents voltage and the y axis represents current. FIG. 4B illustrates the results measuring 4 times the leakage current. Referring to FIG. 4A, upon operation of Sample A, the leakage current of $10^{-2}$ mA/cm$^2$ or greater occurred at −6 V. However, referring to FIG. 4B, upon operation of Sample 1, leakage current of $10^{-4}$ mA/cm$^2$ or less occurred at −6 V. Thus, it can be seen that the second electrode and the organic layer of Sample 1 in which a protective layer was formed after providing the buffering layer on the Mg:Ag layer as the second electrode were not impaired.

Evaluation Example 3

Evaluation for Light Efficiency

Figure 5:
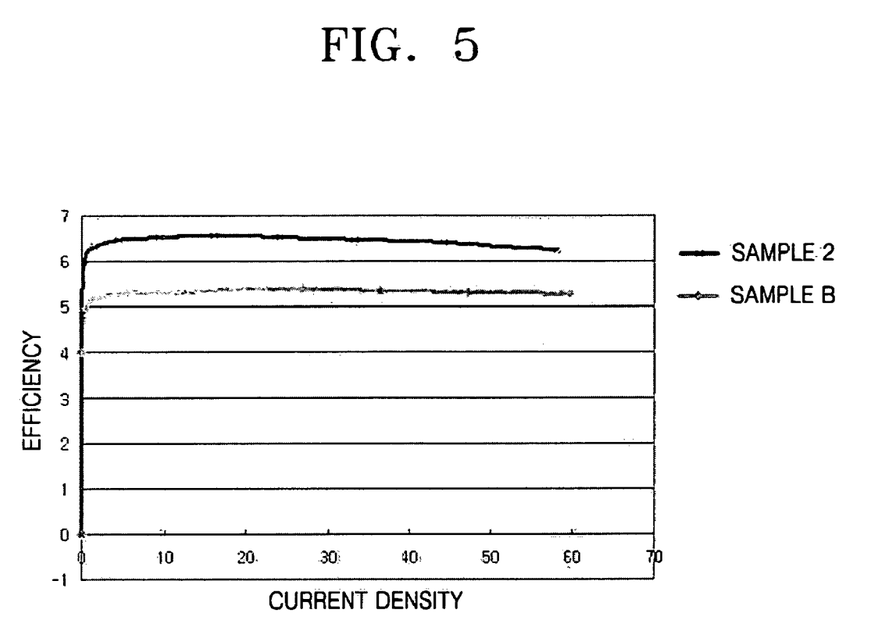
FIG. 5 is a graph of illustrating the efficiency of various OLED devices manufactured in accordance with the principles of the present invention.

The light efficiency of Sample 2 and a device (hereinafter, referred to as "Sample B") having ITO, PEDOT with a thickness of 500 Å, PPV with a thickness of 800 Å, LiF with a thickness of 10 Å, and Mg:Ag with a thickness of 160 Å formed on a glass substrate was determined. The light efficiency was determined using an IVL meter (PhotoResearch PR650, Keithley 238) and the results are illustrated in FIG. 5. Referring to FIG. 5, the light efficiency of Sample 2 was 1.2 to 1.4 times higher than the light efficiency of Sample B, indicating that Sample 2, according to an embodiment of the present invention, had an improved light efficiency.

Evaluation Example 4

Evaluation for Color Purity

The color purity of Sample 2 and Sample B was evaluated using an IVL meter (PhotoResearch PR650, Keithley 238). The results are illustrated in Table 3.

TABLE 3

| Sample name | Color purity | |
| --- | --- | --- |
| | X | Y |
| Sample B | 0.1281 | 0.1616 |
| Sample 2 | 0.1427 | 0.1079 |

Referring to Table 3, the color coordinates of Sample B were 0.12 and 0.16 whereas color coordinates of Sample 2 were 0.14 and 0.10. Thus, it can be seen that Sample 2, according to an embodiment of the present invention, had superior color coordinates.

The organic electroluminescent display device according to an embodiment of the present invention includes at least one layer of a material with a refractive index that is higher than a refractive index of a material of a second electrode, on the second electrode to have superior light extraction efficiency. In addition, by having a buffering layer between the second electrode and a protective layer, the second electrode and an organic layer are not significantly impaired when forming the compact protective layer. Thus, an organic electroluminescent display device having significantly reduced leakage current, no (or virtually no) poor quality pixels, and an increased lifespan may be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent display device, comprising:
   a first electrode provided on a substrate;
   a second electrode formed so as to be insulated from the first electrode;
   one or more organic layers interposed between the first electrode and the second electrode and including at least an emission layer; and
   a plurality of layers formed on the second electrode and composed of a material or materials having a refractive index higher than a refractive index of a material used to form the second electrode,
   wherein the plurality of layers is laminated such that the refractive index of the material of each of the layers sequentially increases in a direction away from the second electrode.

2. The organic electroluminescent display device of claim 1, wherein the material having a refractive index higher than the refractive index of the material used to form the second electrode has a refractive index 0.01 to 3.0 times higher than the refractive index of the material used to form the second electrode.

3. An organic electroluminescent display device, comprising:
   a first electrode provided on a substrate;
   a second electrode formed so as to be insulated from the first electrode;

one or more organic layers interposed between the first electrode and the second electrode and including at least an emission layer; and a protective layer formed on the second electrode, wherein a buffering layer is interposed between the second electrode and the protective layer, and wherein the buffering layer has a refractive index higher than a refractive index of a material used to form the second electrode but lower than a refractive index of a material used to form the protective layer.

4. The organic electroluminescent display device of claim 3, wherein the thickness of the buffering layer is about 300 Å to about 1000 Å.

5. The organic electroluminescent display device of claim 3, wherein the buffering layer comprises at least one material selected from the group consisting of metal oxides and metal nitrides.

6. The organic electroluminescent display device of claim 3, wherein the buffering layer comprises a material with an optical band gap of about 3.0 eV to about 6.0 eV.

7. The organic electroluminescent display device of claim 3, wherein a surface roughness (rms) of the protective layer is about 5 Å to about 50 Å.

8. The organic electroluminescent display device of claim 3, wherein the protective layer comprises at least one material selected from the group consisting of metal oxides and metal nitrides.

9. The organic electroluminescent display device of claim 8, wherein the protective layer further includes a network former.

10. The organic electroluminescent display device of claim 9, wherein the network former comprises at least one element selected from the group consisting of Li, Na, K, Ca, Sn, Rb, Cs, Ba, Pb, Be, Mg, Ce, and Nb.

11. A method of preparing an organic electroluminescent display device, the method comprising:

forming a first electrode on a substrate part;

forming one or more organic layers including at least an emission layer on the first electrode;

forming a second electrode on the organic layer; and forming a plurality of layers comprising a material or materials having a refractive index higher than a refractive index of a material used to form the second electrode on the second electrode, wherein forming the plurality of layers of materials having the refractive index higher than the refractive index of a material used to form the second electrode includes laminating the layers such that the refractive index of the material of each of the layers sequentially increases in a direction away from the second electrode.

12. The method of claim 11, wherein at least one layer of the plurality of layers comprising a material or materials having a refractive index higher than a refractive index of a material used to form the second electrode is a protective layer or a buffering layer.

13. The method of claim 11, wherein at least one layer of the plurality of layers comprising a material or materials having a refractive index higher than a refractive index of a material used to form the second electrode is formed using ion beam assisted deposition (IBAD) that includes an evaporation source and an ion beam source.

14. The method of claim 13, wherein ions emitted from the ion beam source are ions of at least one atom selected from the group consisting of inert gases.

15. The method of claim 13, wherein an energy of the ion beam source is about 50 eV to about 200 eV.

16. The method of claim 13, wherein a ratio of a number of ions emitted from the ion beam source to a number of particles emitted from the evaporation source is in a range of about 1:1 to about 0.9:1.

* * * * *

UNITED STATES PATENT AND TRADEMARK OFFICE
CERTIFICATE OF CORRECTION

PATENT NO. : 7,629,739 B2  Page 1 of 1
APPLICATION NO. : 11/146142
DATED : December 8, 2009
INVENTOR(S) : Han et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1030 days.

Signed and Sealed this

Twenty-first Day of December, 2010

David J. Kappos
*Director of the United States Patent and Trademark Office*